United States Patent [19]
Ando et al.

[11] Patent Number: 5,731,066
[45] Date of Patent: Mar. 24, 1998

[54] ELECTRONIC CIRCUIT DEVICE

[75] Inventors: Akihiro Ando, Yokohama; Osamu Yamada, Hiratsuka; Ryohei Satoh, Yokohama; Takashi Inoue, Yokohama; Masahide Okamoto, Yokohama; Fumiyuki Kobayashi, Sagamihara; Toshihiko Ohta; Minoru Tanaka, both of Hadano, all of Japan

[73] Assignee: Hitachi, Ltd., Tokyo, Japan

[21] Appl. No.: 546,795

[22] Filed: Oct. 23, 1995

[30] Foreign Application Priority Data

Oct. 25, 1994 [JP] Japan .................................. 6-260000

[51] Int. Cl.⁶ .................. B32B 3/00; B32B 15/00; B23K 31/02; H01R 9/09
[52] U.S. Cl. .................. 428/210; 428/432; 428/433; 228/180.21; 174/263
[58] Field of Search .................. 428/210, 432, 428/433; 174/251, 263; 228/180.21

[56] References Cited

U.S. PATENT DOCUMENTS

| | | | |
|---|---|---|---|
| 4,743,489 | 5/1988 | Hasegawa | 428/210 |
| 4,761,325 | 8/1988 | Kurihara et al. | 428/209 |
| 4,861,646 | 8/1989 | Barringer et al. | 428/210 |
| 4,879,156 | 11/1989 | Herron et al. | 428/137 |
| 5,004,640 | 4/1991 | Nakatani et al. | 428/210 |
| 5,429,100 | 7/1995 | Satoh et al. | 361/689 |

FOREIGN PATENT DOCUMENTS

| | | |
|---|---|---|
| 3-57178 | 3/1991 | Japan . |
| 3-165590 | 7/1991 | Japan . |
| 4-142099 | 5/1992 | Japan . |
| 4-164358 | 6/1992 | Japan . |

OTHER PUBLICATIONS

IEEE Transactions on Components, Hybrids, and Manufacturing Technology, vol. 15, No. 2, May 1992 (English document).

*Primary Examiner*—Patrick Ryan
*Assistant Examiner*—Cathy F. Lam
*Attorney, Agent, or Firm*—Fay Sharpe Beall Fagan Minnich & McKee

[57] ABSTRACT

In an electronic circuit device having an input/output pin junction electrode, in order to remarkably improve the junction characteristics such as wettability and junction strength and to drastically simplify the production process, in forming an electronic circuit board in which glass ceramics is used for board material and a wiring conductor and junction electrode wherein the Cu is sized to extend beyond the pin hole so that solder only contacts it and not the ceramic circuit board. The wiring and junction electrode is formed in a same process while forming a cover coat on the electrode using board material, and Au or Au—Ni laminated film is formed on this electrode as occasion demands, and then an electronic component is connected thereto using a solder such a Au—Sn or Au—Ge.

6 Claims, 5 Drawing Sheets

ELECTRONIC CIRCUIT DEVICE

BACKGROUND OF THE INVENTION

The present invention relates to an electronic circuit device comprising a ceramic board having input/output (herein referrd to I/O) pins, and more particularly to an electronic circuit device suitable for improvement in the junction characteristics and simplification of the production process.

As disclosed in JP-A-3-165590, in a conventional device, alumina is used for a board material, Mo or W is used for a conductor material, a conductor pad is formed by conductor paste printing or the like and is plated with Ni and Au, and a sintering operation (heat treatment) is then carried out to thereby form an input/output pin junction electrode.

Further, as disclosed in JP-A-4-164358, in another conventional device, alumina is used as a board material, Pd, Ag—Pd or Cu is used as a conductor material, a wiring conductor and a through hole conductor are printed by screen printing and then sintered, and an input/output pin junction electrode is then formed using the same method.

On the other hand, with the recent rise in demand for miniaturization, higher density and expedition of the electronic circuit, a printed circuit board, which uses low-permittivity glass ceramics as the board material and low-resistance Cu or Ag as the conductor material, has attracted attention. In the case of using this kind of circuit board, in the conventional device, glass ceramics are used for the board material, Cu is used for conductor material, and a Cu conductor pad is plated with Ni and Au to form an input/output pin junction electrode, as disclosed in JP-A-3-57178. In another conventional device, glass ceramics are used for the board material, Ag, Ag—Pd or Au is used as the conductor material, and this conductor pier serves as an input/output pin junction electrode, as disclosed in JP-A-4142099.

Moreover, in the above case where glass ceramics are used as a board material, Cu is used as a conductor material, and a Cu conductor pad is plated with Ni and Au to form an input/output pin junction electrode, the glass ceramic board has a low strength, and therefore there arises a problem that cracking will occur in the circuit board due to residual stress developed at soldering. To cope with this, in the conventional device, it has been customary to form, on a sintered Cu conductor pad, a thin film multi-layer input/output pin junction electrode consisting of 4 to 5 layers such as of Ti—Cu—Ti—Au and Ti—Cu—Ti—Ni—Au, as disclosed in "D. Y. Shih and twelve others: Designs of Low Stress input/output Pin Attach Structure: IEEE TRANSACTIONS ON COMPONENTS, HYBRIDS, AND MANUFACTURING TECHNOLOGY. VOL. 15, NO. 2, (MAY. 1992)".

According to the above conventional technology, as disclosed in JP-A-4-164358, alumina is used as board material, Pd, Ag—Pd or Cu is used as the conductor material, a wiring conductor and a through hole conductor are printed by a screen printing method and sintered, and an input/output pin junction electrode is then formed using the same method. Therefore the manufacturing process is complicated and preservability is low because of oxidation, corrosion and so on of the Cu electrode without a protective film. Further, alumina is used as board material, and therefore the conventional technology cannot be applied to the circuit board of a computer having a higher operation speed.

Further, according to the conventional technology, as disclosed in JP-A-3-57178, glass ceramics are used as the board material, Cu is used as the conductor material, and an input/output pin junction electrode is formed by plating Cu conductor pad with Ni and Au. Therefore, the manufacturing process is complicated and the junction strength is deteriorated due to stress of the plated film. In order to prevent deterioration of junction strength with this structure, the circuit board must have a special configuration, resulting in a more complicated manufacturing process.

Moreover, according to the conventional technology, as disclosed in JP-A-4-142099, glass ceramics are used as the board material, Ag, Ag—Pd or Au is used as the conductor material, and this conductor pier serves as an input/output pin junction electrode. Therefore, the interface between conductor pier and glass ceramic circuit board is applied with stress developed at the time of soldering to deteriorate the junction strength.

Furthermore, according to the conventional technology, as disclosed in "D. Y. Shih and twelve others: Designs of Low Stress input/output Pin Attach Structures: IEEE TRANSACTIONS ON COMPONENTS, HYBRIDS, AND MANUFACTURING TECHNOLOGY. VOL. 15, NO. 2, (MAY. 1992)", sintered Cu conductor pad is formed thereon with a thin film multi-layer input/output pin junction electrode consisting of 4 to 5 layers such as of Ti—Cu—Ti—Au and Ti—Cu—Ti—Ni—Au. Therefore, the circuit board must be smoothed by grinding, polishing or the like means before the thin film forming process and, what is more, a multi-layer thin film forming process must be carried out, giving rise to problems that the complicated manufacturing process prolongs the production term and the deterioration of production yield increases the board price.

SUMMARY

An object of the present invention is to supply, through a simplified process and at a lower cost, an electronic circuit board which uses low permittivity glass ceramics for the board material and a low resistance copper material (hereafter only referred to Cu), which is selected from pure Cu, Cu—Ti alloy, Cu—Zr alloy and Cu—Al alloy, for conductor, and which has excellent preservability and high junction strength.

In order to achieve the above end, according to the invention, glass ceramics are used for the board material, and copper is used for conductor material, green sheets 11 are printed with a through hole 12 and a conductor pattern 14. The thus-printed green sheets are arranged as required to form a predetermined circuit to be a laminate printed with a copper conductor pad 13 having a diameter larger than a pin head diameter of an input/output pin 3 (FIG. 4) and with a glass ceramic cover coat 15 around the copper conductor pad, the laminate is pressure-bonded and then sintered in its entirety (FIG. 1), and the copper conductor pad on the glass ceramics is formed thereon with a protective film, by plating or the like means, such as a Au film 5 as shown in FIG. 2 or a laminated film of Au 4 and Ni 5 as shown in FIG. 3 for the purpose of surface protection as occasion demands.

After the formation of the electrode, green sheets are laminated and pressure-bonded and sintered integrally, and therefore the circuit board production process can be simplified. In case of forming the electrode, the copper conductor pad 13 having a diameter larger than a pin head diameter of an input/output pin 3, is printed and the glass ceramic cover coat 15 is formed therearound by printing, and therefore a high-strength copper junction electrode can be formed through a simple process. The junction electrode is formed simultaneously with the sintering of the circuit board, and therefore the process can be simplified.

Further, the protective film such as Au film or Ni—Au laminated film is formed for the purpose of surface protection as occasion demands, and therefore the preservability is excellent.

FIG. 4 is a fragmentary sectional view of a circuit board produced according to the invention, to which input/output pins are connected using a solder material or a brazing filler material.

If the input/output pin 3 is connected to the circuit board produced through the above process using the solder material 2, the surface protective film disappears during the soldering to allow the copper conductor pad 13 formed as electrode to be joined to the solder 2, thereby establishing the junction between the circuit board and the input/output pin. In this case, stress concentration, developed by the cover coat 15 at the end of fillet at the soldering, is distant from the end of the electrode, and therefore the stress is relieved to ensure the junction strength.

DETAILED DESCRIPTION

Preferred embodiments of the present invention are described hereunder with reference to the drawings.
Embodiment 1

Figure 3:
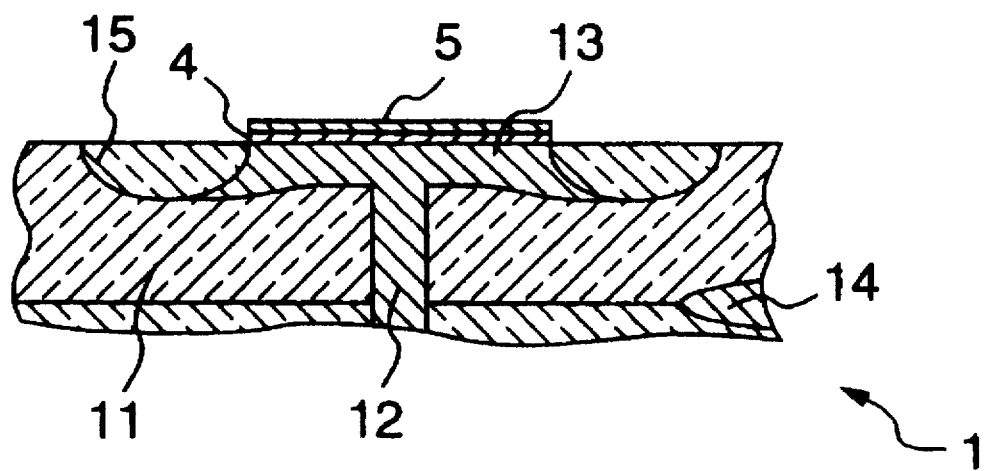
FIG. 3 is a fragmentary sectional view of an electronic circuit board with input/output pin junction electrode according to the invention.
Figure 5:
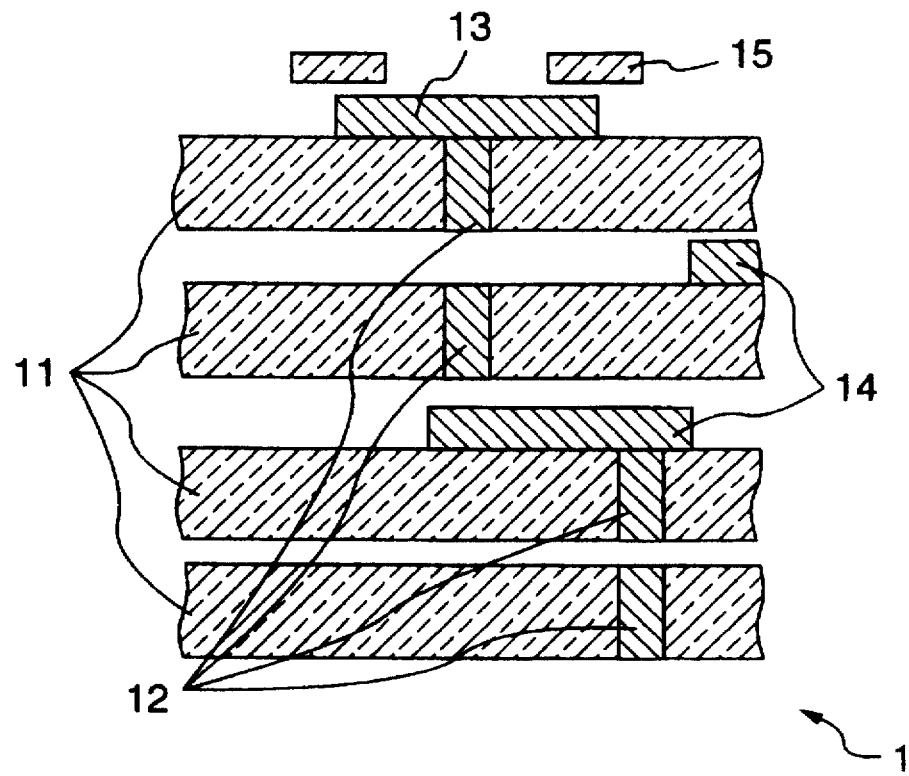
FIG. 5 is a fragmentary sectional view of green sheets of an electronic circuit board with an input/output pin junction electrode according to the invention, which green sheets have been printed with conductor but not sintered yet.

FIG. 5 shows four layers of green sheet of a glass ceramic wiring circuit board according to the invention adjacent to an input/output pin junction pad, which green sheets have been printed with conductor but not sintered yet. The total number of layers of green sheet depends on the electrical characteristics and the like. These green sheets 11 are obtained by making through holes, necessary for the circuit structure, in glass ceramic green sheets made mainly of borosilicate glass, alumina and mullite and by printing conductor Cu pastes 12, 13, 14 thereto. As shown in this drawing, an electrode forming a copper conductor pad 13 has a diameter larger than a pin head diameter of an input/output pin 3 (FIG. 3). By forming a glass ceramic cover coat around the electrode conductor Cu pad by printing, a high-strength Cu junction electrode can be formed through a simple process. It is preferred that the electrode conductor Cu has a minimum thickness required for the soldering in consideration of the thermal stress thereof at the time of sintering and soldering, and it is desired that the thickness thereof after the sintering is 3 to 30 microns.

Figure 1:
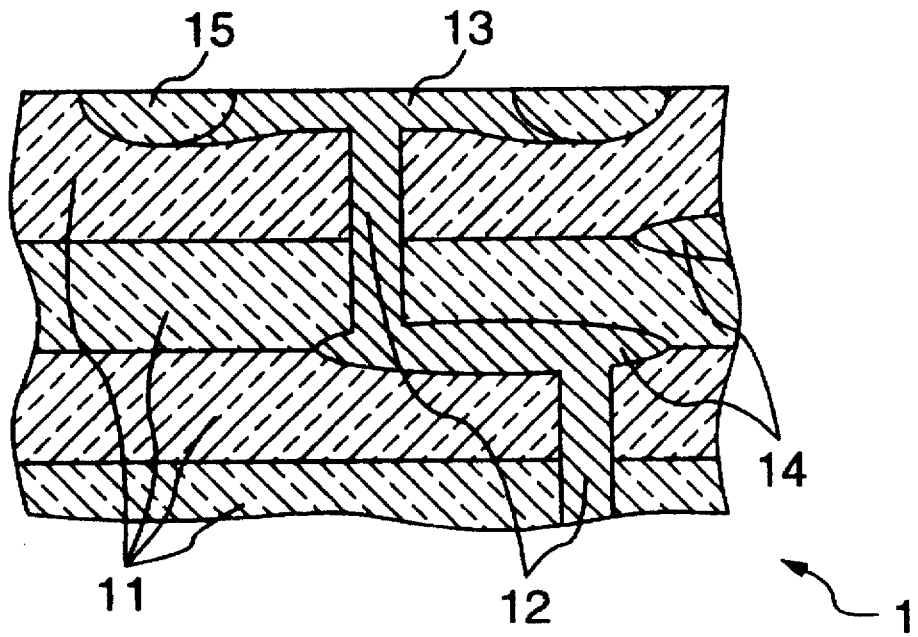
FIG. 1 is a fragmentary sectional view of an electronic circuit board with an input/output pin junction electrode according to the present invention, which circuit board has been sintered.

FIG. 1 is a fragmentary sectional view of a circuit board obtained by pressure-bonding the above-described printed green sheets and then sintering them in its entirety. One of effects of the invention is that the circuit board body 1, the cover coat 15 and the junction electrode 13 can be formed by one sintering operation.

Figure 4:
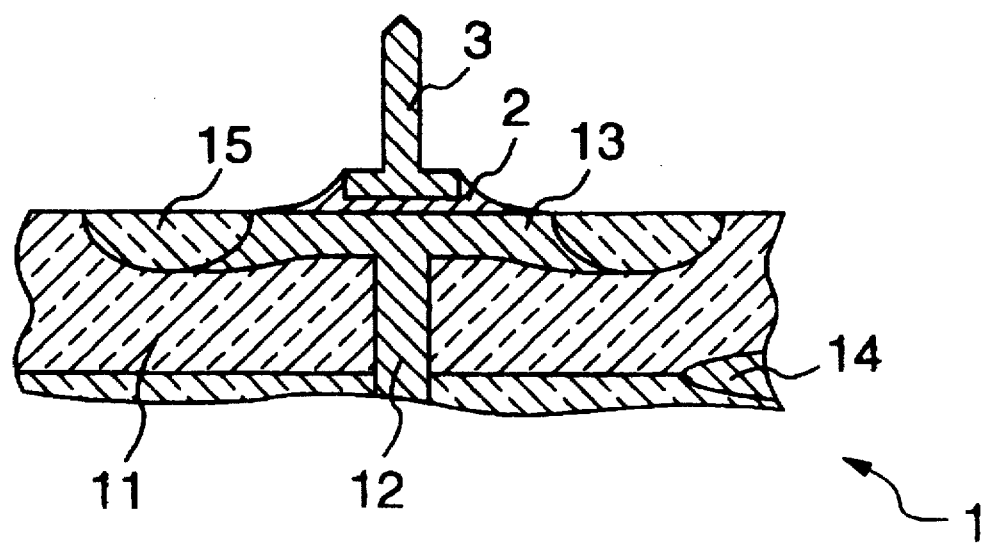
FIG. 4 is a fragmentary sectional view of an electronic circuit board according to the invention, in which an input/output pin is soldered to the input/output pin junction electrode.

FIG. 4 is a fragmentary sectional view of the glass ceramic circuit board 1 with the input/output pin junction electrode to which an input/output pin 3 is connected using a solder 2. In the embodiment, Au-20 mass % Sn eutectic alloy was used as the solder 2, and however, Au—Sn alloy of other composition and other solder including Au—Ge alloy, Sn, Sn—Ag alloy, Sn—Pu alloy and Sn—Sb alloy may be used. Although the input/output pins used in this embodiment were made by plating Cu alloy with Ni and Au, they may be made by plating other material such as Koval or 42-alloy with Ni and Au. Further, the input/output pins may be made of these alloys with or without Au-plating alone. Configuration of the pin 3 is as shown in FIG. 4, and the pin used in this embodiment has a diameter of a pin head, which has a flange shape, of the pin of 300 to 1000 microns, a pin head thickness of 50 to 300 microns and a pin diameter of 150 to 500 microns, and however, these configuration and dimensions are not limitative in this invention. In this embodiment, junction was carried out by supplying solder to the pin, positioning the pin on the ceramic circuit board using a pin positioning jig made of carbon, and subjecting to the reflow operation in a furnace with a hydrogen/nitrogen reducing atmosphere (Max. temperature: 320° C., time duration of keeping at a temperature not lower than the melting point: 17 minutes), and however, this method is not limitative, but other arbitrary method and junction conditions may be adopted.

In order to prove the effect of ensuring the junction strength obtained by the invention, a junction strength between an input/output pin and the junction electrode of the invention embodiment was compared with that between an input/output pin and the conventional junction electrode prepared by forming a Cu conductor pad on a glass ceramic circuit board by sintering and then plating the Cu conductor pad with Ni to a thickness of 5 microns to form a junction reaction layer and with Au to a thickness of 0.07 microns to form a protective film. The pin was chucked and pulled by a jig to examine the relation of the fracture mode and the load at that time with the number of reflow operations.

Figure 6:
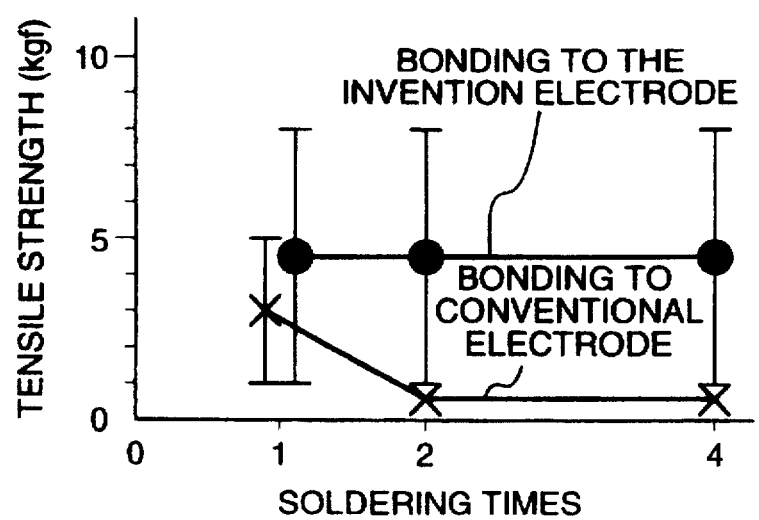
FIG. 6 is a graph showing the characteristics obtained as a result of evaluation of junction strength after the soldering.

FIG. 6 shows the results of that examination. In the case where the input/output pin was connected to the electrode of the invention embodiment, the fracture mode was breaking of pin up to eight times of reflow operation and the load was 1 to 8 kgf, which means that the input/output pin can be connected with satisfactory junction strength. In the case where the input/output pin was connected to the conventional junction electrode, the fracture mode was breaking of pin and rupture of circuit board after the subjection to only one reflow operation and the load was 1 to 5 kgf and, after the subjection to two or more times of reflow operation, the load decreased and the mode was rupture of circuit board in every case. Residual stress developed by the soldering is to be applied from the solder end portion to the circuit board. In the junction electrode of the invention, this stress concentration point is present at the copper material which has high toughness and high strength, and therefore the ceramic circuit board will not be ruptured. On the other hand, according to the conventional method, since the solder end portion is present at glass ceramics having no toughness and low strength and since the stress of Ni-plated film is applied in addition to the residual stress of the solder, the circuit board will be ruptured. For this reason, the invention is effective for ensuring the junction strength.

This embodiment has been described about the junction of the input/output pin, but the same effect can also be obtained in the case of the junction of other electronic components such as LSI, resistance and condenser.

Embodiment 2

FIG. 5 shows four layers of green sheet of a glass ceramic wiring circuit board according to the invention adjacent to an input/output pin junction pad, which green sheets have been printed with conductor but not sintered yet. The total number of layers of green sheet depends on the electrical characteristics and the like. These green sheets 11 are obtained by making through holes, necessary for the circuit structure, in glass ceramic green sheets made mainly of borosilicate glass, alumina and mullite and by printing conductor Cu pastes 12, 13, 14 thereon. As shown in this drawing, an electrode forming copper conductor pad 13 has a diameter larger than a pin head diameter of an input/output pin 3. By forming a glass ceramic cover coat around the electrode conductor Cu pad by printing, a high-strength Cu junction electrode can be formed through a simple process. It is preferred that the electrode conductor CU has a minimum thickness required for the soldering in consideration of the thermal stress thereof at the time of sintering and soldering, and it is desired that the thickness thereof after the sintering is 3 to 30 microns.

Figure 2:
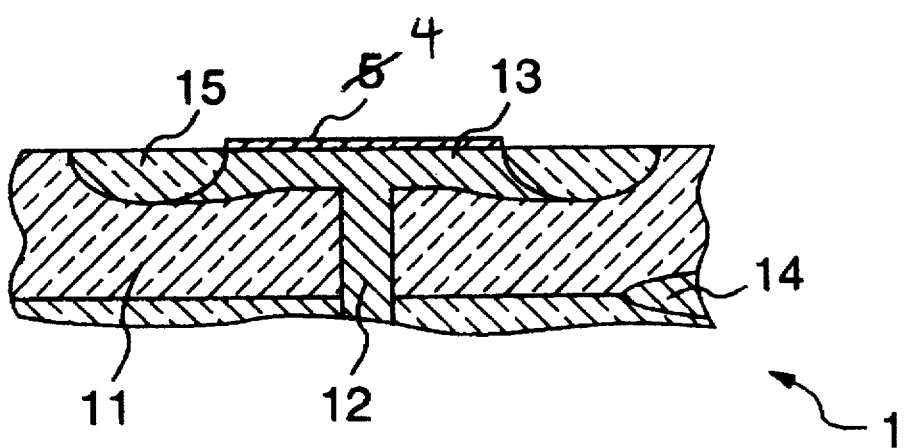
FIG. 2 is a fragmentary sectional view of an electronic circuit board with input/output pin junction electrode according to the invention.

FIG. 2 shows a sintered glass ceramic circuit board having a protective film formed thereon by being plated with Au 5 for preventing surface oxidation and corrosion. It is enough for this protective film to have a minimum thickness capable of surface protection. Although a necessary film thickness depends on the storage conditions, it is desirable to be 0.05 to 4 microns. In the present embodiment, the layer of Au was formed by plating which does not need a patterning or the like process, and however, it may be formed by and other film forming method than plating, such as spattering, chemical vapor deposition and evaporation process.

FIG. 4 is a fragmentary sectional view of the glass ceramic circuit board 1 with the input/output pin junction electrode to which an input/output pin 3 is connected using a solder 2. In this embodiment, Au-20 mass % Sn eutectic alloy was used as the solder 2, however, Au—Sn alloy of other composition and other solder including Au—Ge alloy, Sn, Sn—Ag-alloy, Sn—Pu Alloy and Sn—Sb alloy may be used. Although the input/output pin used in this embodiment was made by plating Cu alloy with Ni and Au, it may be made by plating other material such as Koval or 42-alloy with Ni and Au. Further, the input/output pin may be made of these alloys with or without Au-plating alone. Configuration of the pin 3 is as shown in FIG. 4, and the pin used in this embodiment has a pin head diameter of 300 to 1000 microns, a pin head thickness of 50 to 300 microns and a pin diameter of 150 to 500 microns, and however, these configuration and dimensions are not limitative in the invention. In this embodiment, the junction was carried out by supplying solder to the pin, positioning the pin on the ceramic circuit board using a pin positioning jig made of carbon, and subjecting it to the reflow operation in a furnace with a hydrogen/nitrogen reducing atmosphere (Max. temperature: 320° C., time duration of keeping at a temperature not lower than the melting point: 17 minutes). However, this method is not limitative, and other arbitrary methods and conditions of junction may be adopted.

Figure 7:
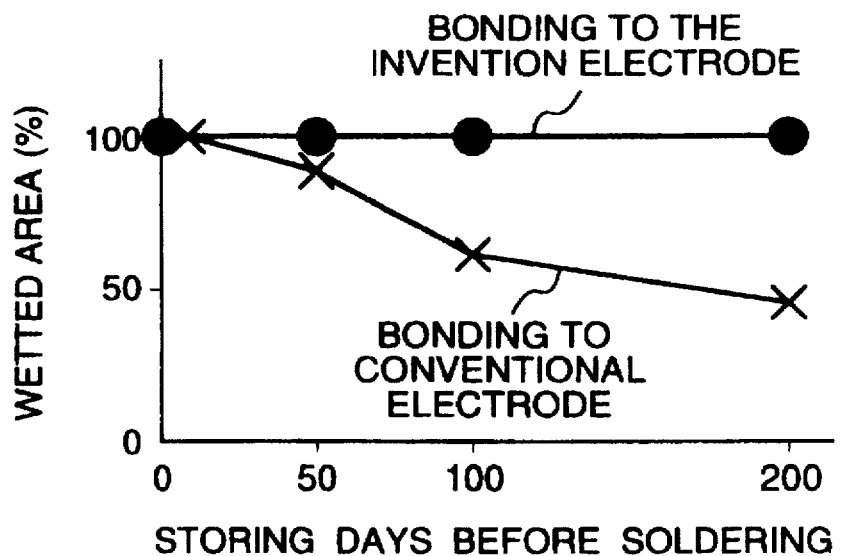
FIG. 7 is a graph showing the characteristics obtained as an evaluation result of wettability of the junction electrode.

In order to prove the effect of surface protection obtained by the invention, the junction electrode of this embodiment which has the surface protective film and the conventional electrode which does not have the surface protective film to leave Cu exposed were examined in terms of the relation between solder wettability and storage term. Evaluation of the wettability was made using the percentage of the area wetted with solder on the pad after the reflow operation relative to the area of the pad. An electronic dry storage shed was used to store on condition that its door should be opened and closed more than once a day. FIG. 7 shows the results of that examination. Concerning the electrode of this embodiment, the solder had spread to wet the entire surface of the pad even after the storage for 200 days. Concerning the conventional electrode which does not have the surface protective film leaves Cu exposed, however, the wetting area decreased after the storage for 100 days. For this reason, the present invention is effective for surface protection. Although Au was used to form the surface protective film in this embodiment, it was confirmed that the same effect could be obtained even when Pd, Ag—Pd, Pd alloy or the like was used in place of Au.

Figure 8:
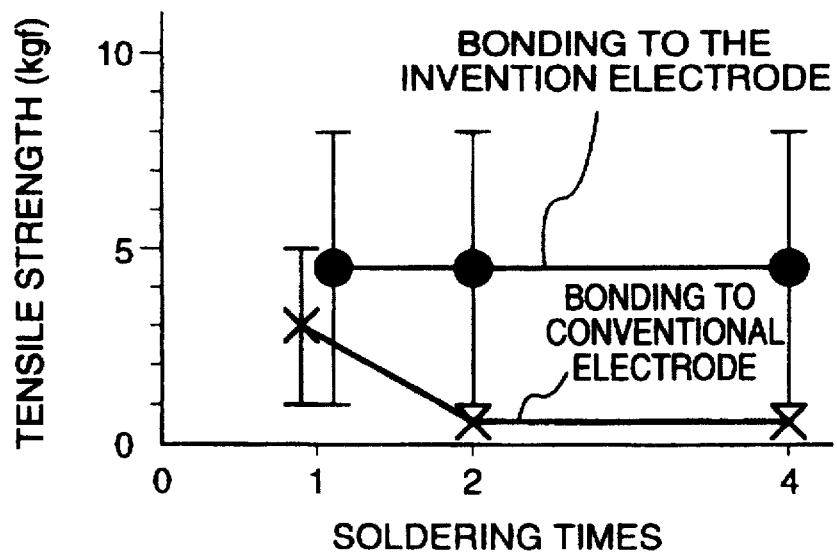
FIG. 8 is a graph showing the characteristics obtained as an evaluation result of junction strength after the soldering.

Next, in order to prove the effect of ensuring the junction strength obtained also by the invention, a junction strength between an input/output pin and the junction electrode of this embodiment was compared with that between an input/output pin and the conventional junction electrode prepared by forming a Cu conductor pad on a glass ceramic circuit board by sintering and then plating the Cu conductor pad with Ni to a thickness of 5 microns to form a junction reaction layer and with Au to a thickness of 0.07 microns to form a protective film. The pin was chucked and pulled by a jig to examine the relation of the fracture mode and the load at that time with the number of reflow operations. FIG. 8 shows the results of that examination. In the case where the input/output pin was connected to the electrode of this embodiment, the fracture mode was breaking of pin up to eight times of reflow operation and the load was 1 to 8 kgf, which means that the input/output pin can be connected with satisfactory junction strength. In the case where the input/output pin was connected to the conventional junction electrode, the fracture mode was breaking of pin and rupture of circuit board after the subjection to only one reflow operation and the load was 1 to 5 kgf and, after the subjection to two or more times of reflow operation, the load decreased and the mode was rupture of circuit board in every case. Residual stress developed by the soldering is to be applied from the solder end portion to the circuit board. In the junction electrode of the invention, this stress concentration point is present at Cu having high toughness and high strength, and therefore the ceramic circuit board never be ruptured. On the other hand, according to the conventional method, since the end portion of the solder is present on the glass ceramics which has very low toughness and low strength and since the stress of Ni-plated film is applied in addition to the residual stress of the solder, the circuit board will be ruptured. For this reason, the invention is effective for ensuring the junction strength.

This embodiment has been described about the junction of the input/output pin, but the same effect can also be obtained in the case of the junction of other electronic components such as LSI, resistance and condenser.

Embodiment 3

FIG. 5 shows four layers of green sheet of a glass ceramic wiring circuit board according to the invention adjacent to an input/output pin junction pad, which green sheets have been printed with conductor but not sintered yet. The total number of layers of green sheet depends on the electrical characteristics and the like. These green sheets 11 are obtained by making through holes, necessary for the circuit structure, in glass ceramic green sheets made mainly of borosilicate glass, alumina and mullite and by printing conductor Cu pastes 12, 13, 14 thereto. As shown in FIG. 5, an electrode forming copper conductor pad 13 has a diameter larger than a pin head diameter of an input/output pin 3. By forming a glass ceramic cover coat around the electrode conductor Cu pad by printing, a high-strength Cu junction electrode can be formed through a simple process. It is preferred that the electrode conductor Cu has a minimum thickness required for the soldering in consideration of the thermal stress thereof at the time of sintering and soldering, and it is desired that the thickness thereof after the sintering is 3 to 30 microns.

FIG. 3 shows a sintered glass ceramic circuit board having a Ni—Au laminated film, consisting of a lower Ni film 4 and an upper Au film 5, formed thereon by plating as a protective film against surface oxidation and corrosion. It is enough for the protective film to have a minimum thickness capable of surface protection because Ni is made to disappear as a result of reaction with solder. Although a necessary film thickness depends on the reflowing conditions and the storage conditions, it is desirable to be 0.05 to 4 microns. In the present embodiment, the layers of Ni, Au were formed by plating which does not need a patterning or the like process, and however, they may be formed by other film forming methods than plating, such as spattering, chemical vapor deposition and evaporation process.

FIG. 4 is a fragmentary sectional view of the glass ceramic circuit board 1 with the input/output pin junction electrode to which an input/output pin 3 is connected using a solder 2. In this embodiment, Au-20 mass % Sn eutectic alloy was used as the solder 2, and however, Au—Sn alloy of other composition and other solder including Au—Ge alloy, Sn, Sn—Ag-alloy, Sn—Pb Alloy and Sn—Sb alloy may be used. Although the input/output pin used in this embodiment was made by plating Cu alloy with Ni and Au, it may be made by plating other material such as Koval or 42-alloy with Ni and Au. Further, the input/output pin may be made of these alloys with or without Au-plating alone. Configuration of the pin 3 is as shown in FIG. 4, and the pin used in this embodiment has a pin head diameter of 300 to 1000 microns, a pin head thickness of 50 to 300 microns and a pin diameter of 150 to 500 microns, and however, these configuration and dimensions are not limitative in the invention. In this embodiment, junction was carried out by supplying solder to the pin, positioning the pin on the ceramic circuit board using a pin positioning jig made of carbon, and subjecting to the reflow operation in a furnace with a hydrogen/nitrogen reducing atmosphere (Max. temperature: 320° C., time duration of keeping at a temperature not lower than the melting point: 17 minutes), and however, this method is not limitative, but other arbitrary method and conditions of junction may be adopted.

Figure 9:
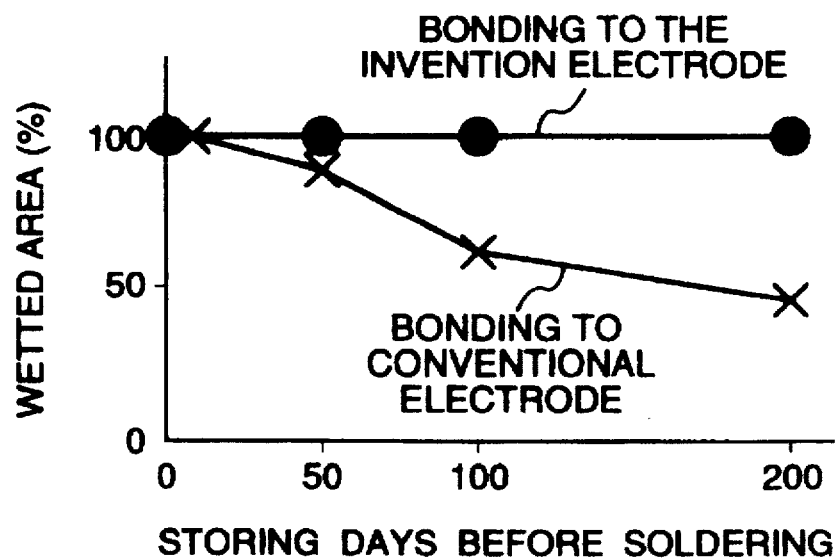
FIG. 9 is a graph showing the characteristics obtained as an evaluation result of wettability of junction electrode.

In order to prove the effect of surface protection obtained by the invention, the junction electrode of this embodiment which has the surface protective film and the conventional electrode which doesn't have the surface protective film to leave Cu exposed were examined in terms of the relation between solder wettability and storage term. Evaluation of the wettability was made using the percentage of the area wetted with solder on the pad after the reflow operation relative to the area of the pad. An electronic dry storage shed was used to store on condition that its door should be opened and closed more than once a day. FIG. 9 shows the results of that examination. Concerning the electrode of this embodiment, the solder had spread to wet the entire surface of the pad even after the storage for 200 days. Concerning the conventional electrode which doesn't have the surface protective film to leave Cu exposed, however, the wetting area decreased after the storage for 100 days. For this reason, the present invention is effective for surface protection. Although Au was used to form the surface protective film in this embodiment, it was confirmed that the same effect could be obtained even when Pd, Ag—Pd, Pd alloy or the like was used in place of Au.

Figure 10:
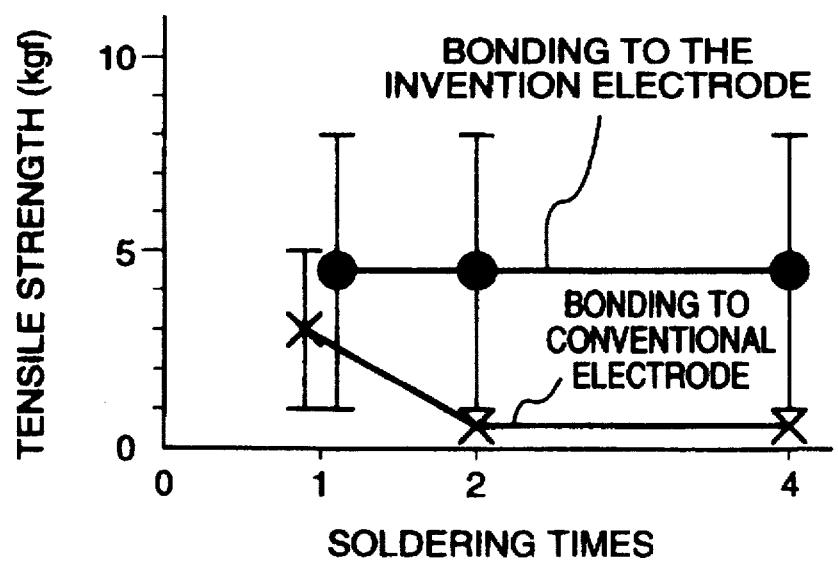
FIG. 10 is a graph showing the characteristics obtained as an evaluation result of junction strength after the soldering.

Next, in order to prove the effect of ensuring the junction strength obtained also by the invention, a junction strength between an input/output pin and the junction electrode of this embodiment was compared with that between an input/output pin and the conventional junction electrode prepared by forming a Cu conductor pad on a glass ceramic circuit board by sintering and then plating the Cu conductor pad with Ni to a thickness of 5 microns to form a junction reaction layer and with Au to a thickness of 0.07 microns to form a protective film. The pin was chucked and pulled by a jig to examine the relation of the fracture mode and the load at that time with the number of reflow operations. FIG. 10 shows the results of that examination. In the case where the input/output pin was connected to the electrode of this embodiment, the fracture mode was breaking of pin up to eight times of reflow operation and the load was 1 to 8 kgf, which means that the input/output pin can be connected with satisfactory junction strength. In the case where the input/output pin was connected to the conventional junction electrode, the fracture mode was breaking of pin and rupture of circuit board after the subjection to only one reflow operation and the load was 1 to 5 kgf and, after the subjection to two or more times of reflow operation, the load decreased and the mode was rupture, of circuit board in every case. Residual stress developed by the soldering is to be applied from the solder end portion to the circuit board. In the junction electrode of the invention, this stress concentration point is present at Cu having high toughness and high strength, and therefore the ceramic circuit board will never be ruptured. On the other hand, according to the conventional method, since the solder end portion is present at glass ceramics having no toughness and low strength and since the stress of Ni-plated film is applied in addition to the residual stress of the solder, the circuit board will be ruptured. For this reason, the invention is effective for ensuring the junction strength.

This embodiment has been described about the junction of the input/output pin, but the same effect can also be obtained in the case of the junction of other electronic components such as LSI, resistance and condenser.

According to the present invention, in the electronic circuit device in which ceramics, particularly glass ceramics is used for board material and Cu or Cu alloy is used for wiring conductor and junction electrode, the junction characteristics including wettability and junction strength can be remarkably improved and the production process can be drastically shortened.

We claim:

1. An electronic circuit device having a wiring board, wherein a surface of the wiring board is provided with a copper conductor pad, a cover coat of glass ceramics and an electronic component having an electrode bonded to the surface of the copper conductor pad by a solder at a bonding location, said cover coat covering an outer peripheral region of said copper conductor pad intermediate said electrode and said surface of said wiring board, and wherein said copper conductor pad extends beyond said electrode of said electronic component at said bonding location.

2. The electronic circuit device according to claim 1, wherein said solder is any one of pure copper, a Cu—Ti alloy a Cu—Zr alloy and a Cu—Al alloy.

3. The electronic device according to claim 1, wherein said wiring board is made of glass ceramics whose primary components are borosilicate glass, alumina and mullite.

4. The electronic circuit device according to claim 1 wherein said copper conductor pad is coated with a surface protective film of Au and said electrode of said electronic component is soldered thereto.

5. The electronic circuit device according to claim 1, wherein said copper conductor pad is coated with a surface protective laminated film of Ni and Au and said electrode of said electronic component is soldered thereto.

6. An electronic circuit device according to claim 1, wherein said electronic component is an input/output pin comprising a pin head which is bonded to the surface of said copper conductor pad by the solder and wherein said pin has a diameter at said bonding location smaller than a diameter of said copper conductive pad and said pin head is disposed to solely contact the copper conductor pad to avoid bonding said pin directly to said wiring board.

* * * * *